(12) United States Patent
Zeng et al.

(10) Patent No.: US 6,445,035 B1
(45) Date of Patent: Sep. 3, 2002

(54) POWER MOS DEVICE WITH BURIED GATE AND GROOVE

(75) Inventors: Jun Zeng; Gary M. Dolny, both of Mountaintop; Christopher B. Kocon, Plains; Linda S. Brush, Mountaintop, all of PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/624,533

(22) Filed: Jul. 24, 2000

(51) Int. Cl.$^7$ ............................................... H01L 29/94
(52) U.S. Cl. ...................... 257/329; 257/326; 438/212; 438/241; 438/258; 438/266
(58) Field of Search ................................ 257/329, 326; 438/212, 241, 258, 266

(56) References Cited

U.S. PATENT DOCUMENTS

| | | | |
|---|---|---|---|
| 6,104,061 A | * | 8/2000 | Forbes et al. ................ 257/330 |
| 6,150,693 A | * | 11/2000 | Wollesen ..................... 257/330 |
| 6,236,099 B1 | * | 5/2001 | Boden, Jr. ................... 257/495 |

FOREIGN PATENT DOCUMENTS

JP          361142775 A  *  6/1986  ........... H01L/29/78

* cited by examiner

*Primary Examiner*—Nathan Flynn
*Assistant Examiner*—Scott R Wilson
(74) *Attorney, Agent, or Firm*—Thomas R. Fitzgerald

(57) ABSTRACT

An MOS power device a substrate comprises an upper layer having an upper surface and an underlying drain region, a well region of a first conductance type disposed in the upper layer over the drain region, and a plurality of spaced apart buried gates, each of which comprises a trench that extends from the upper surface of the upper layer through the well region into the drain region. Each trench comprises an insulating material lining its surface, a conductive material filling its lower portion to a selected level substantially below the upper surface of the upper layer, and an insulating material substantially filling the remainder of the trench. A plurality of highly doped source regions of a second conductance type are disposed in the upper layer adjacent the upper portion of each trench, each source region extending from the upper surface to a depth in the upper layer selected to provide overlap between the source regions and the conductive material in the trenches. A groove in each of the highly doped source regions extends through the source regions into the well region and terminates in a nadir. A highly doped body region of a first conductance type is disposed in the well region adjacent both to the nadir of one or more of the grooves and to adjacent source regions penetrated by the grooves. A conductive layer is disposed over the substrate and electrically contacts the body and source regions. A process for fabricating a device produces an MOS power device that avoids the loss of channel width and provides reduced channel resistance without sacrificing device ruggedness and dynamic characteristics.

14 Claims, 2 Drawing Sheets

POWER MOS DEVICE WITH BURIED GATE AND GROOVE

FIELD OF THE INVENTION

The present invention is related to MOS semiconductor devices and, more particularly, to a power MOS semiconductor device with continuous body contact and a wide active channel.

BACKGROUND OF THE INVENTION

Co-pending, commonly assigned U.S. application Ser. No. 09/260,411, filed Mar. 1, 1999 by Christopher B. Kocon et al. for MOS-GATED DEVICE HAVING A BURIED GATE AND PROCESS FOR FORMING SAME, the disclosure of which is incorporated herein by reference, describes a device expected to provide high cell packing density through the use of a recessed and buried gate. FIG. 1 (FIG. 2 in application Ser. No. 09/260,411) depicts a trench MOS-gated device 200 that includes a doped N+ substrate 201 on which is deposited an epitaxial doped upper layer 202. Epitaxial layer 202 includes drain region 203, heavily doped P+ body regions 204, and P-well regions 205. Abutting body regions 204 in epitaxial layer 203 are heavily doped N+ source regions 206, which are separated from each other by a gate trench 207 that has dielectric sidewalls 208 and floor 209. Contained within trench 207 is a gate material 210, filled to a selected level 211, and an overlying dielectric layer 212. Selected level 211 of gate material 210 is approximately coplanar with the selected depth 216 of N+ source regions 206, thereby providing overlap between source regions 206 and gate material 210. The surface 213 of gate dielectric layer 212 is substantially coplanar with the surface 214 of epitaxial layer 202. Deposited metal layer 215 contacts body regions 204 and source regions 206.

FIG. 2 (FIG. 3B in application Ser. No. 09/260,411) depicts an alternative prior art trench MOS-gated device 300 that includes a doped N+ substrate 301, on which is disposed a doped upper layer 302. Upper layer 302 includes drain region 303 and P-wells 305. N+ source regions 306, formed by ion implantation and diffusion to a selected depth 316 in upper layer 302, are also separated by gate trench 307. Gate trenches 307 each have dielectric sidewalls 308 and a floor 309 and contain conductive gate material 310, filled to a selected level 311, and an overlying dielectric layer 312. The surface 313 of gate dielectric layer 312 is substantially coplanar with the surface 314 of upper layer 302. Metal layer 315 is deposited on surface 314 to contact body regions 304 and source regions 306.

Although the just-described prior art structures are expected to provide high cell packing density, the periodic placement of the P+ body regions produces a high series resistance, resulting in degradation of the electro-thermal dynamic characteristics and ruggedness as well as SOA (Safe Operation Area) of the devices. Also, depending on the total area of the P+ body regions, some loss of channel width can result.

SUMMARY OF THE INVENTION

The present invention is directed to an MOS power device a substrate that comprises an upper layer having an upper surface and an underlying drain region, a well region of a first conductance type disposed in the upper layer over the drain region, and a plurality of spaced apart buried gates, each of which comprises a trench that extends from the upper surface of the upper layer through the well region into the drain region. Each trench comprises an insulating material lining its surface, a conductive material filling its lower portion to a selected level substantially below the upper surface of the upper layer, and an insulating material substantially filling the remainder of the trench. A plurality of highly doped source regions of a second conductance type are disposed in the upper layer adjacent the upper portion of each trench, each source region extending from the upper surface to a depth in the upper layer selected to provide overlap between the source regions and the conductive material in the trenches. A "V" groove in each of the highly doped source regions extends through the source regions into the well region and terminates in a nadir. A highly doped body region of a first conductance type is disposed in the well region adjacent both to the nadir of one or more of the grooves and to adjacent source regions penetrated by the grooves. A conductive layer is disposed over the substrate and electrically contacts the body and source regions.

The present invention is further directed to a process for fabricating an MOS power device that comprises: providing a semiconductor substrate comprising an upper layer that has an upper surface and an underlying drain region, and forming a well region of a first conductance type in the upper layer overlying the drain region. A plurality of spaced apart gate trenches, each extending from the upper surface of the upper layer through the well region into the drain region, are formed and lined with an insulating material. A lower portion of each said trench is filled with a conductive material to a selected level substantially below the upper surface of the upper layer, and the upper portion of each trench is substantially filled with an insulating material, thereby forming a plurality of trench gates.

A plurality of highly doped source regions of a second conductance type are formed in the upper layer adjacent the upper portion of each trench, each source region extending from the upper surface to a depth in the upper layer selected to provide overlap between the source regions and the conductive material in the trenches. A "U" groove is formed in each of the highly doped source regions, each groove extending through the source region into the well region and terminating in a nadir. A highly doped body region of a first conductance type is implanted in the well region adjacent the nadir of one or more of the grooves, and also adjacent source regions penetrated by the grooves. A conductive layer is deposited over the substrate for electrically contacting the body and source regions.

The MOS power device of the present invention, which is formed by a completely self-aligned process, avoids the loss of channel width and provides reduced channel resistance without sacrificing device ruggedness and dynamic characteristics, as well as SOA.

DETAILED DESCRIPTION OF THE INVENTION

Figure 1:
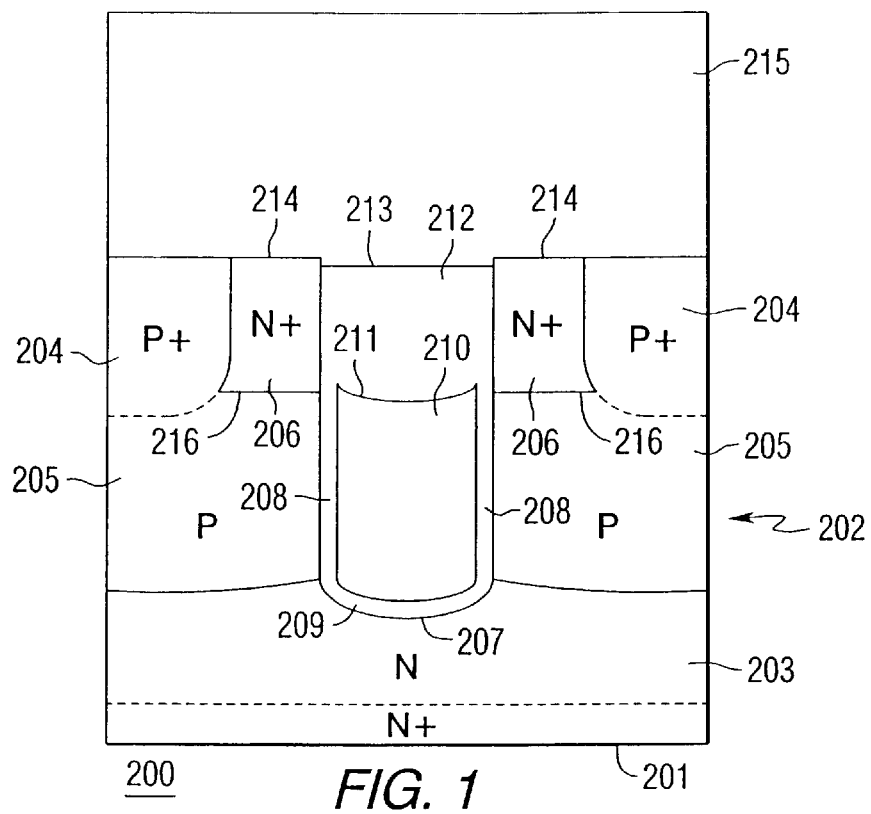
FIG. 1 schematically depicts a cross-section of a trench MOS-gated device 200 of the prior art.
Figure 2:
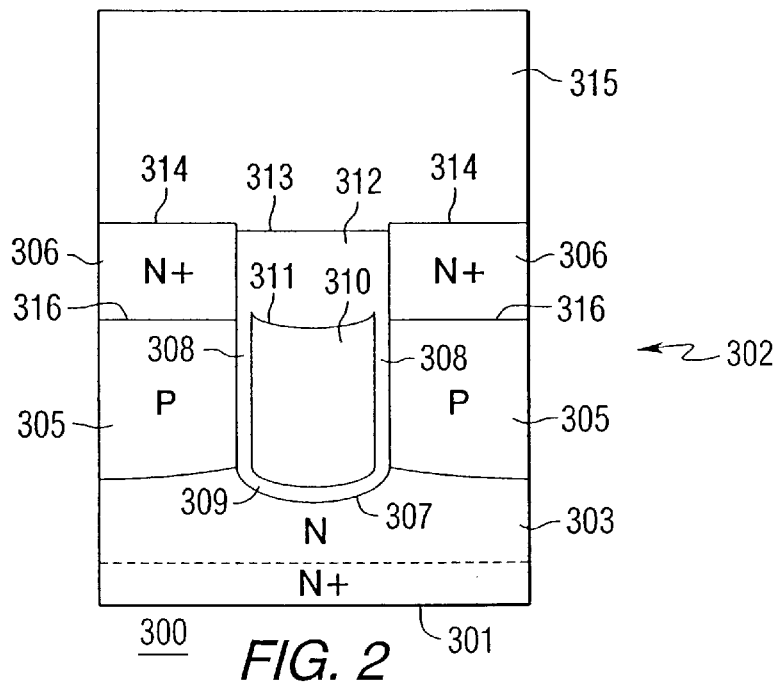
FIG. 2 is a schematic cross-sectional representation of another trench MOS-gated device 300 of the prior art.
Figure 3:
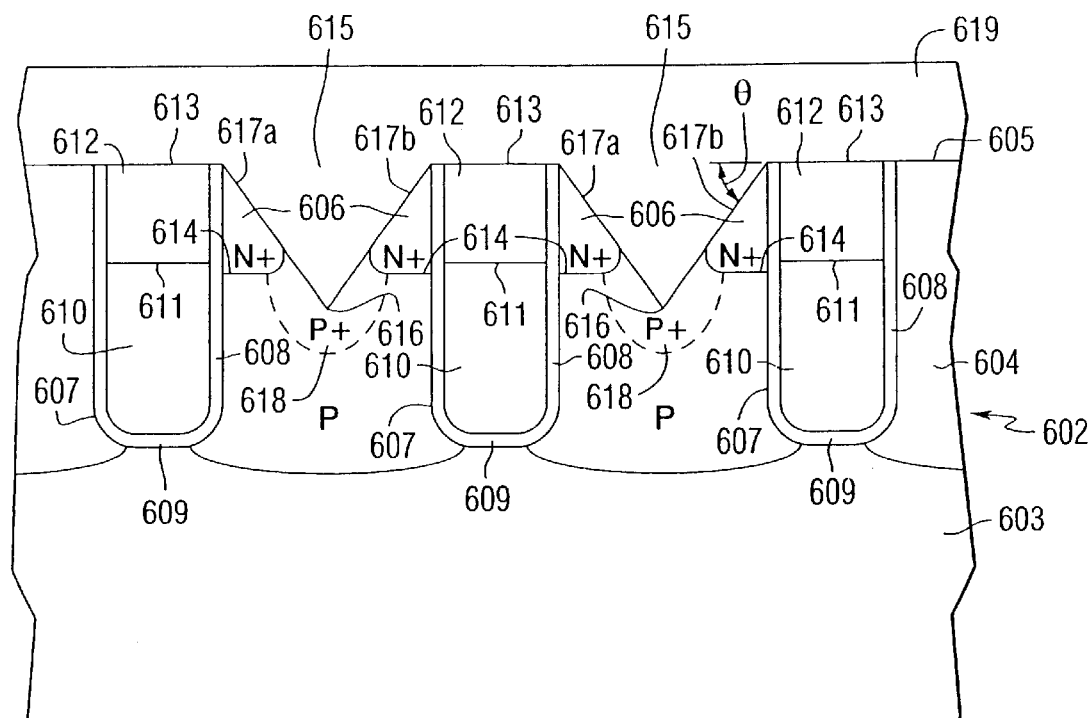
FIG. 3 schematically depict a cross-section of a trench MOS-gated device 600 in accordance with the present invention.

FIG. 3 is a schematic cross-sectional view of an MOS power device 600 of the present invention Device 600 includes a heavily doped semiconductor substrate 601, which can be monocrystalline silicon, on which is formed a doped upper layer 602 that includes a drain region 603 and well regions 604. Upper layer 602 can be epitaxially grown silicon or, for lower voltage devices (ca 12V), a heavily doped portion of substrate 601. Well regions 604 are formed in layer 602 by doping into upper layer upper surface 605.

Gate trenches 607, formed using a trench mask as known in the art, extend from surface 605 through well regions 604 to drain region 603. Trench dielectric sidewalls 608 and floor 609, preferably comprising silicon dioxide, which can be either deposited or grown, are formed in gate trench 607, which is then filled with a conductive gate material 610, which can be, for example, a metal, a silicide, or doped polysilicon, to a selected level 611. Filling of trenches 607 is completed by forming an isolation dielectric layer 612, which can be silicon dioxide or BPSG, over conductive gate material 610 in trenches 607 and on surface 605. A planarization dielectric etch is performed to re-expose surface 605 without removing dielectric material 612 from trenches 607. Surface 613 of dielectric layer 612 in trenches 607 is thereby rendered substantially coplanar with upper surface 605 of layer 602. It may be advantageus, however, to etch surface 613 slightly below surface 605 in order to increase source contact and improve device on-resistance characteristics.

Source regions 606 are formed by ion implantation and diffusion to a selected depth 614 in well region 604. Because conductive gate material 610 is recessed within gate trench 607 to permit the inclusion of dielectric layer 612 of sufficient thickness to provide gate isolation, diffusions to form source regions 606 must be deep enough to ensure overlap with conductive gate material 610.

A groove 615 extending below depth 614 is etched through each of source regions 606, terminating in a nadir 616 in well region 604. Preferably, groove 615 is V-shaped, comprising two intersecting surfaces 617a and 617b that intersect at an acute angle, preferably about 60 to about 80 degrees. If KOH in propanol-water is used as the etch agent, groove 615 is etched at an angle θ of 54.74 degrees with respect to upper surface 605; in this instance, the angle of intersection of surfaces 617a and 617b is equal to 180−2θ, or about 70.5 degrees.

A highly doped body region 618 is formed in well region 604 adjacent nadir 618 at also adjacent the source region 606 penetrated by groove 615. For a P+ body, a high dose, about $5\times10^{15}$ cm$^{-2}$, of boron can be implanted at an angle of 0 degrees, followed by rapid thermal annealing. It should be noted that unlike the discussed prior art, formation of body region 618 in device 600 of the present invention does not require the use of a body mask.

A metal layer 619 is deposited on substrate 601 to contact body regions 618 and source regions 606. Metal (not shown) can be deposited on the reverse side of substrate 601 to provide contact with drain region 603. Although source regions 606 are shown as having N polarity and body regions 618 are depicted as having P polarity in device 600, it is understood that the polarities of these regions can be reversed from those shown in FIG. 3.

Gate trenches 607 included in a device of the present invention may have an open-cell stripe topology or a closed-cell cellular topology. Furthermore, in the closed-cell cellular topology, the trenches may have a square or, more preferably, a hexagonal configuration. Although device 600, as schematically depicted in FIG. 3, is a power MOSFET, the present invention is applicable to the construction of other MOS-gated devices such as an insulated gate bipolar transistor (IGBT), an MOS-controlled thyristor (MCT), and an accumulation field effect transistor (ACCUFET).

Figure 4:
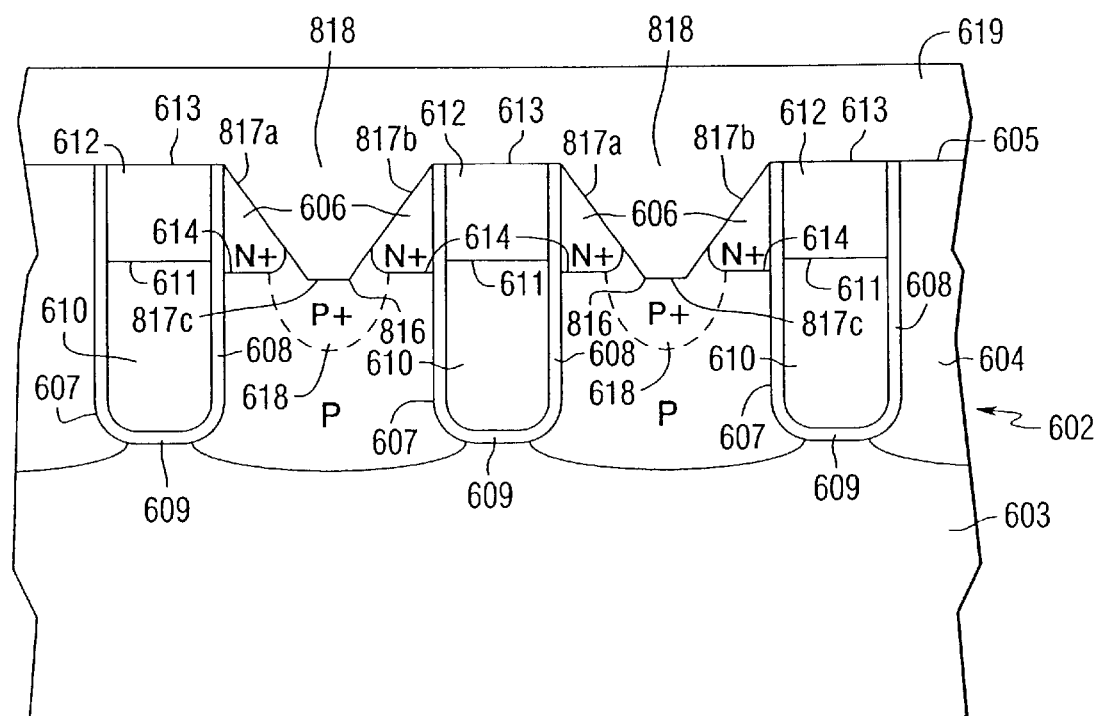
FIG. 4 is a schematic cross-sectional representation of another trench MOS-gated device 800 of the present invention.

Various etch technologies for controlling sidewall angles can be applied to the present invention. FIG. 4 schematically illustrates trench MOS-gated device 800 similar to device 600, except that groove 818, terminating in nadir 816, comprises three intersecting surfaces 817a, 817b, and 817c.

The invention has been described in detail for the purpose of illustration, but it is understood that such detail is solely for that purpose, and variations can be made therein by those skilled in the art without departing from the spirit and scope of the invention, which is defined by the following claims.

What is claimed is:

1. An MOS power device comprising:
   a substrate that comprises an upper layer having an upper surface and an underlying drain region;
   a well region of a first conductance type disposed in said upper layer overlying said drain region;
   a plurality of spaced apart buried gates, each said gate comprising a trench extending from said upper surface of said upper layer through said well region into said drain region, each said trench comprising an insulating material lining its surface, a conductive material filling its lower portion to a selected level substantially below the upper surface of the upper layer, and an insulating material substantially filling the remainder of said trench;
   a plurality of highly doped source regions of a second conductance type disposed in said upper layer adjacent said upper portion of each said trench, each said source region extending from said upper surface to a depth in said upper layer selected to provide overlap between said source regions and said conductive material in said trenches;
   a groove in each of said highly doped source regions, each said groove extending through said source regions into said well region and terminating in a nadir;
   a highly doped body region of a first conductance type disposed in said well region adjacent said nadir of one or more of said grooves, said body region also being adjacent source regions penetrated by said grooves; and
   a conductive layer disposed over said substrate and electrically contacting said body and source regions.

2. The MOS power device of claim 1 wherein said grooves are V-shaped, comprising two surfaces that intersect at said nadir, said surfaces being disposed at an acute angle to one another.

3. The MOS power device of claim 2 wherein said angle comprises about 60 to about 80 degrees.

4. The MOS power device of claim 3 wherein said angle comprises about 54 to about 55 degrees.

5. The MOS power device of claim 1 wherein said grooves comprise three or more surfaces.

6. The MOS power device of claim 1 wherein said first conductance type is P and said second conductance type is N.

7. The MOS power device of claim 1 wherein said first conductance type is N and said second conductance type is P.

8. The MOS power device of claim 1 wherein said upper layer comprises an epitaxial layer.

9. The MOS power device of claim 1 wherein said upper layer comprises a highly doped portion of said substrate.

10. The MOS power device of claim 1 wherein said substrate comprises monocrystalline silicon.

11. The MOS power device of claim 1 wherein said insulating material in said trenches comprises silicon dioxide.

12. The MOS power device of claim 1 wherein said conductive material in said trenches is selected from the group consisting of a metal, a silicide, and doped polysilicon.

13. The MOS power device of claim 1 wherein said device is selected from the group consisting of a power MOSFET, an insulated gate bipolar transistor (IGBT), an MOS-controlled thyristor (MCT), and an accumulation field effect transistor (ACCUFET).

14. The MOS power device of claim 1 wherein said conductive layer fills said grooves, electrically contacting said body and said source regions.

* * * * *